(12) United States Patent
Tseng et al.

(10) Patent No.: US 8,578,600 B2
(45) Date of Patent: Nov. 12, 2013

(54) PROCESS FOR MANUFACTURING A CIRCUIT BOARD

(75) Inventors: Tzyy-Jang Tseng, Hsinchu (TW); Shu-Sheng Chiang, Taipei (TW); Tsung-Yuan Chen, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 453 days.

(21) Appl. No.: 12/783,837

(22) Filed: May 20, 2010

(65) Prior Publication Data

US 2011/0155440 A1    Jun. 30, 2011

(30) Foreign Application Priority Data

Dec. 30, 2009 (TW) .............................. 98145798 A

(51) Int. Cl.
*H01K 3/10*    (2006.01)

(52) U.S. Cl.
USPC ................. 29/852; 29/825; 29/830; 29/846

(58) Field of Classification Search
USPC ................................. 29/825, 830, 846, 852
See application file for complete search history.

(56) References Cited

U.S. PATENT DOCUMENTS

| | | | | |
|---|---|---|---|---|
| 4,935,584 A | * | 6/1990 | Boggs | 174/262 |
| 5,108,553 A | * | 4/1992 | Foster et al. | 205/125 |
| 5,347,712 A | * | 9/1994 | Yasuda et al. | 29/852 |
| 5,537,740 A | * | 7/1996 | Shirai et al. | 29/852 |
| 6,717,070 B2 | * | 4/2004 | Watanabe | 174/262 |
| 6,930,257 B1 | | 8/2005 | Hiner et al. | |
| 6,967,124 B1 | | 11/2005 | Huemoeller et al. | |
| 7,084,354 B2 | * | 8/2006 | Boggs et al. | 174/262 |
| 7,552,531 B2 | * | 6/2009 | Takada et al. | 29/852 |
| 7,698,813 B2 | * | 4/2010 | Wang | 29/852 |

FOREIGN PATENT DOCUMENTS

| | | |
|---|---|---|
| TW | 200805611 | 1/2008 |
| TW | 200952131 | 12/2009 |

OTHER PUBLICATIONS

"Office Action of Taiwan counterpart application" issued on Jul. 26, 2012, p1-p7, in which the listed reference was cited.

* cited by examiner

*Primary Examiner* — Carl Arbes
(74) *Attorney, Agent, or Firm* — J.C. Patents

(57) ABSTRACT

A circuit board including a circuit substrate, a dielectric layer, a first conductive layer and a second conductive layer is provided. The circuit substrate has a first surface and a first circuit layer. The dielectric layer is disposed on the circuit substrate and covers the first surface and the first circuit layer. The dielectric layer has a second surface, at least a blind via extended from the second surface to the first circuit layer and an intaglio pattern. The first conductive layer is disposed inside the blind via. The second conductive layer is disposed in the intaglio pattern and the blind via and covers the first conductive layer. The second conductive layer is electrically connected with the first circuit layer through the first conductive layer.

11 Claims, 4 Drawing Sheets

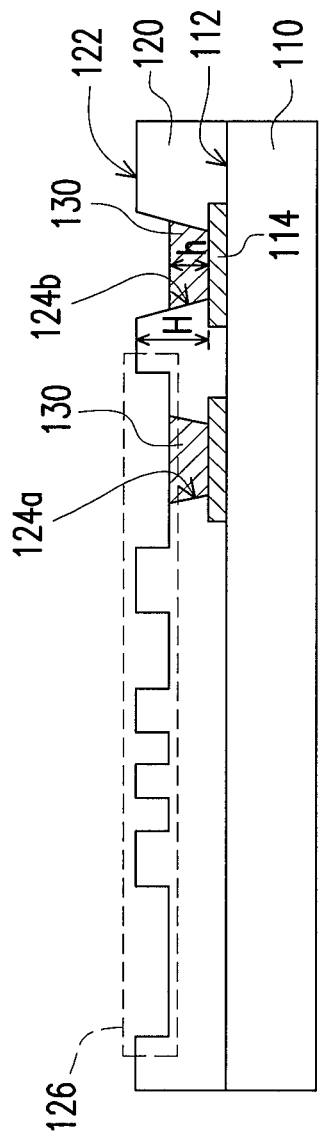
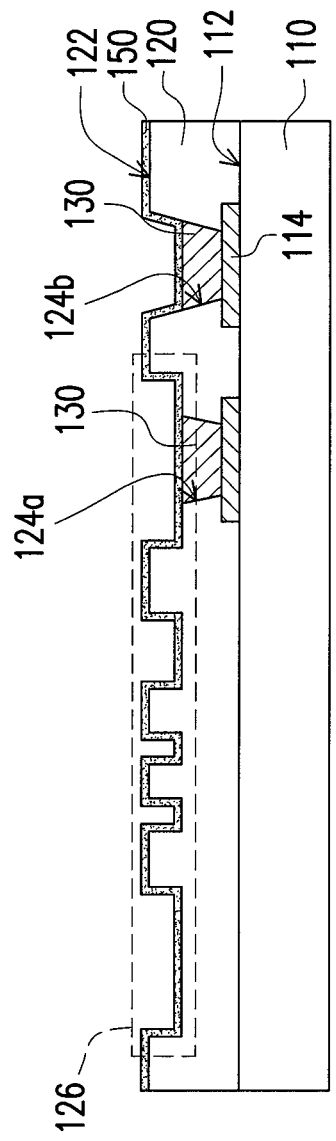

PROCESS FOR MANUFACTURING A CIRCUIT BOARD

CROSS-REFERENCE TO RELATED APPLICATION

This application claims the priority benefit of Taiwan application serial no. 98145798, filed on Dec. 30, 2009. The entirety of the above-mentioned patent application is hereby incorporated by reference herein and made a part of this specification.

BACKGROUND OF THE INVENTION

1. Field of the Invention

The present invention relates to a circuit board and a process for manufacturing the same. More particularly, the present invention relates to a circuit board with a relatively better reliability and a process for manufacturing the circuit board.

2. Description of Related Art

According to the current technologies, an embedded circuit board has been evolved from a common non-embedded circuit board. In particular, the common non-embedded circuit board is characterized in that circuits therein protrude from a surface of a dielectric layer. By contrast, circuits of the embedded circuit board are buried in the dielectric layer. Currently, a circuit structure of the circuit board is formed by performing a photolithography and etching process or a laser ablating process.

The fabricating process for forming build-up wiring structure of the embedded circuit board fabricated with the use of the laser ablating process comprises the following steps. A dielectric layer is formed on a circuit board having a circuit layer. Then, an intaglio pattern and a blind via connecting to the circuit layer on the surface of the dielectric layer is formed by using a laser beam. Thereafter, an electroplating process is performed to form a conductive layer filling up the blind via and the intaglio pattern. Herein, the build-up wiring structure of the embedded circuit board is roughly formed so far.

Since the depth of the blind via is different from the depth of the intaglio, the electroplating condition is not easy to be controlled when the electroplating process is performed, which leads to poor uniformity of the thickness of the conductive layer. Therefore, when a process for removing a portion of the conductive layer at the outside of the intaglio and the blind via is later performed, it is hard to control the thickness of the removed portion of the conductive layer. Hence, it is easy to improperly thinning the conductive layer of the embedded circuit board or leaving the conductive residue on the dielectric layer. Moreover, when the build-up wiring structure is fabricated on the aforementioned dielectric layer, the quality of the electroplating process is poor and the yield of the electroplating process is low. Therefore, the fabrication yield of the build-up wiring structure is decreased and the reliability of the circuit board is decreased as well.

SUMMARY OF THE INVENTION

The present invention provides a circuit board and a process for manufacturing the circuit board capable of improving the reliability of the circuit board.

The present invention provides a circuit board including a circuit substrate, a dielectric layer, a first conductive layer and a second conductive layer is provided. The circuit substrate has a first surface and a first circuit layer. The dielectric layer is disposed on the circuit substrate and covers the first surface and the first circuit layer. The dielectric layer has a second surface, at least a blind via extended form the second surface to the first circuit layer and an intaglio pattern. The first conductive layer is disposed in the blind via. The second conductive layer is disposed in the intaglio pattern and the blind via and covers the first conductive layer. The second conductive layer is electrically connected to the first circuit layer through the first conductive layer.

According to an embodiment of the present invention, a height of the blind via is denoted as H and a thickness of the first conductive layer is denoted as h, and a relationship between h and H complies with $0.2 \leq (h/H) \leq 0.9$.

According to an embodiment of the present invention, the intaglio pattern is connected to the blind via.

According to an embodiment of the present invention, the circuit board further comprises an activation layer disposed between the intaglio pattern of the dielectric layer and the second conductive layer and disposed between the first conductive layer and the second conductive layer.

According to an embodiment of the present invention, the first circuit layer is embedded in the circuit substrate and a surface of the first circuit layer is substantially aligned to the first surface of the circuit substrate.

According to an embodiment of the present invention, the first circuit layer is disposed on the first surface of the circuit substrate.

According to an embodiment of the present invention, the second conductive layer is substantially aligned to the second surface of the dielectric layer.

In the present application, a process for manufacturing a circuit board is also provided. First, a circuit substrate is provided. The circuit has a first surface and a first circuit layer. Then, a dielectric layer is formed on the circuit substrate. The dielectric layer has a second surface and covers the first surface and the first circuit layer. Next, at least one blind via extended from the second surface of the dielectric layer to the first circuit layer and an intaglio pattern on the second surface of the dielectric layer are formed by using a laser beam. After, a first conductive layer is formed in the blind via. Then, a second conductive layer is formed in the intaglio pattern and the blind via. The second conductive layer covers the first conductive layer, and the second conductive layer is electrically connected with the first circuit layer through the first conductive layer.

According to an embodiment of the present invention, a method of forming the above mentioned first conductive layer in the blind via comprises a chemical deposition.

According to an embodiment of the present invention, a height of the blind via is denoted as H and a thickness of the first conductive layer is denoted as h, and a relationship between h and H complies with $0.2 \leq (h/H) \leq 0.9$.

According to an embodiment of the present invention, before the second conductive layer is formed, the process for manufacturing a circuit board further comprises forming an activation layer on the second surface of the dielectric layer, in the intaglio pattern and on the first conductive layer.

According to an embodiment of the present invention, a method of forming the above mentioned second conductive layer in the intaglio pattern the blind via comprises a chemical deposition.

According to an embodiment of the present invention, after the above mentioned second conductive layer is formed, the process for manufacturing a circuit board further comprises performing a grinding process to the second conductive layer until the second surface of the dielectric layer is exposed.

According to an embodiment of the present invention, the first circuit layer is embedded in the circuit substrate, and a surface of the first circuit layer is substantially aligned to the first surface of the circuit substrate.

According to an embodiment of the present invention, the first circuit layer is disposed on the first surface of the circuit substrate.

According to an embodiment of the present invention, the intaglio pattern is connected to the blind via.

According to an embodiment of the present invention, the second conductive layer is substantially aligned to the second surface of the dielectric layer.

Accordingly, in the process for fabricating the circuit board of the present invention, the first conductive layer is formed in the blind via in advance to decrease the step height between the blind via and the intaglio pattern, and then the second conductive layer is formed on the first conductive layer in the blind via and in the intaglio pattern. Hence, the thickness uniformity and the surface smoothness of the conductive layer formed in the blind via and the intaglio pattern can be well improved. By comparing with the conventional technique, the circuit board and the process for fabricating the circuit board of the present embodiment can effectively avoid the poor result of the conventional via filling plating and the poor uniformity of the conductive layer and can improve the reliability of the circuit board.

In order to make the aforementioned and other features and advantages of the present invention more comprehensible, several embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

FIGS. 2A to 2F are schematic cross-sectional view illustrating a process for manufacturing a circuit board according to one embodiment of the present invention.

DESCRIPTION OF THE EMBODIMENTS

Figure 1:
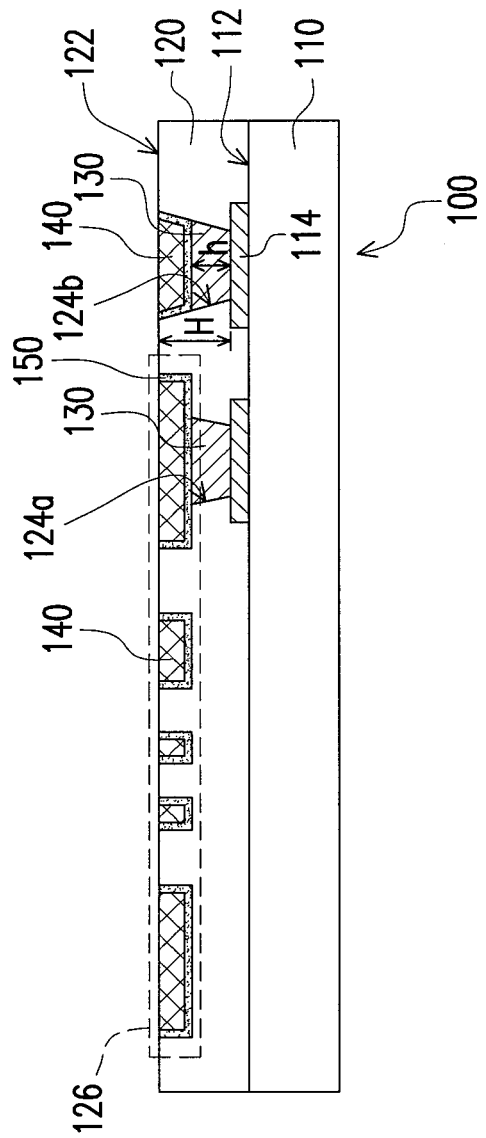
FIG. 1 is a schematic cross-sectional view of a circuit board according to one embodiment of the present invention.

FIG. 1 is a schematic cross-sectional view of a circuit board according to one embodiment of the present invention showing. Referring to FIG. 1, in the present embodiment, a circuit board 100 includes a circuit substrate 110, a dielectric layer 120, a first conductive layer 130 and a second conductive layer 140. It should be noticed that the structure of the circuit board 100 can have a single-layered circuit layer or a multi-layered circuit layer. That is, the circuit board 100 can be a single-layered circuit board, a double-layered circuit board or a multi-layered circuit board. In the present embodiment, the circuit board 100 depicted in FIG. 1 as a build-up wiring board is used to describe the invention.

Specifically, the circuit substrate 110 has a first surface 112 and a first circuit layer 114, wherein the first circuit layer 114 is disposed on the first surface 112 of the circuit substrate 110. That is to say, the first circuit layer 114 can be a kind of normal circuit layer (which is not the embedded circuit layer). It should be mentioned that although the first circuit layer 114 is disposed on the first surface 112 of the circuit substrate 110 in the embodiment shown in FIG. 1, the first circuit layer 114 can be embedded in the circuit substrate 110 and the surface of the first circuit layer 114 is substantially aligned with the first surface 112 in the other embodiment not shown by drawings. That is, the first circuit layer 114 is basically a kind of embedded circuit layer. In other words, the structure of the circuit substrate 110 depicted in FIG. 1 merely serves as an example of the present invention but not a limitation to the present invention.

The dielectric layer 120 is disposed on the circuit substrate 110 and covers the first surface 112 and the first circuit layer 114. In the present embodiment, the dielectric layer 120 has a second surface 122, at least one blind via (FIG. 1 schematically only shows two blind vias 124a, 124b) extended from the second surface 122 to the first circuit layer 114 and a intaglio pattern 126, wherein the blind via 124a is connected to the intaglio pattern 126.

The first conductive layer 130 is disposed in the blind vias 124a, 124b. The height of the blind via 124b (or the blind via 124a) is denoted as H and the thickness of the first conductive layer 130 is denoted as h. Preferably, the relationship between the H and h complies with and $0.2 \leq (h/H) \leq 0.9$. The second conductive layer 140 is disposed in the intaglio pattern 126 and the blind vias 124a, 124b and covers the first conductive layer 130. That is to say, the second conductive layer 140 is disposed in the intaglio pattern 126 and on the first conductive layer 130. More particularly, the second conductive layer 140 is electrically connected with the first circuit layer 114 of the circuit substrate 110 through first conductive layer 130, and the second conductive layer 140 is substantially aligned to the second surface 122 of the dielectric layer 120.

In addition, the circuit board 100 of the present embodiment further comprises an activation layer 150, wherein the activation layer 150 is disposed between the intaglio pattern 126 of the dielectric layer 120 and the second conductive layer 140, and disposed between the first conductive layer 130 and the second conductive layer 140. Wherein, a component of the activation layer 150 comprises metal, such as palladium (Pd).

Since the blind vias 124a and 124b of the dielectric layer 120 of the present embodiment has the first conductive layer 130 formed therein, the step height between the blind vias 124a and 124b and the intaglio pattern 126 can be decreased. When the ratio of h to H is getting large and it means the thickness of the first conductive layer 130 is relatively large, the thickness of the second conductive layer 140 disposed in the blind vias 124a and 124b is substantially equal to the thickness of the second conductive layer 140 to be disposed in the intaglio pattern 126. Hence, when the second conductive layer 140 is disposed in the blind vias 124a and 124b and in the intaglio pattern 126, the thickness uniformity and the surface smoothness of the second conductive layer 140 can be well improved. In brief, by comparing with the conventional technique, the design of the circuit board 100 of the present embodiment can effectively avoid the poor result of the conventional via filling plating and the poor uniformity of the conductive layer and can improve the reliability of the circuit board.

Up to here, only the structure of the circuit board 100 of the present invention is described, while a process of fabricating the circuit board 100 of the present invention is not yet provided. Hence, the structure of the circuit board 100 shown in FIG. 1 is used as an example accompanying with FIGS. 2A through 2F to detail the process for fabricating the circuit board 100 in the following descriptions.

Figure 2A:
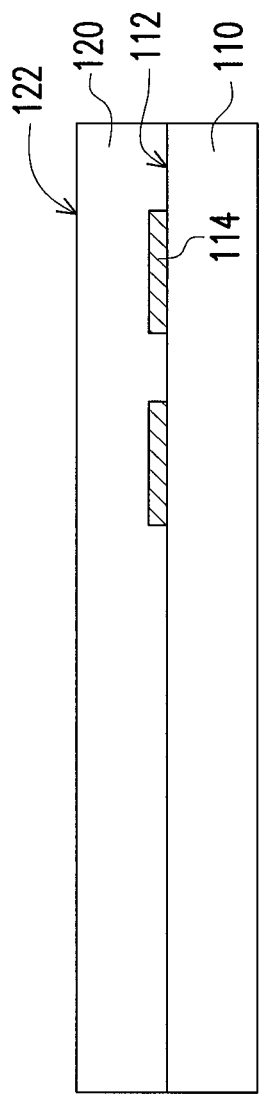

FIGS. 2A to 2F are schematic cross-sectional view illustrating a process of manufacturing a circuit board according to one embodiment of the present invention. Referring to FIG. 2A first, according to the process of manufacturing the circuit board 100 in the present embodiment, a circuit substrate 110 is provided in the first. The circuit substrate 110 has a first surface 112 and a first circuit layer 114, wherein the first circuit layer 114 is disposed on the first surface 112 of the circuit substrate 110. That is, the first circuit layer 114 is basically a kind of normal circuit layer (which is not an embedded circuit layer). It should be mentioned that, in the other embodiment not shown by drawings, the first circuit layer 114 can be also embedded in the circuit substrate 110, and the surface of the first circuit layer 114 and the first surface 112 of the circuit substrate 110 are substantially aligned. That is, the first circuit layer 114 is basically a kind of embedded circuit layer. Thus, the structure of the circuit substrate 110 depicted in FIG. 2A merely serves as an example of the present invention but not a limitation to the present invention.

Referring to FIG. 2A again, a dielectric layer 120 is formed on the circuit substrate 110. The dielectric layer 120 has a second surface 122, and the dielectric layer 120 covers the first surface 112 and the first circuit layer 114.

Figure 2B:
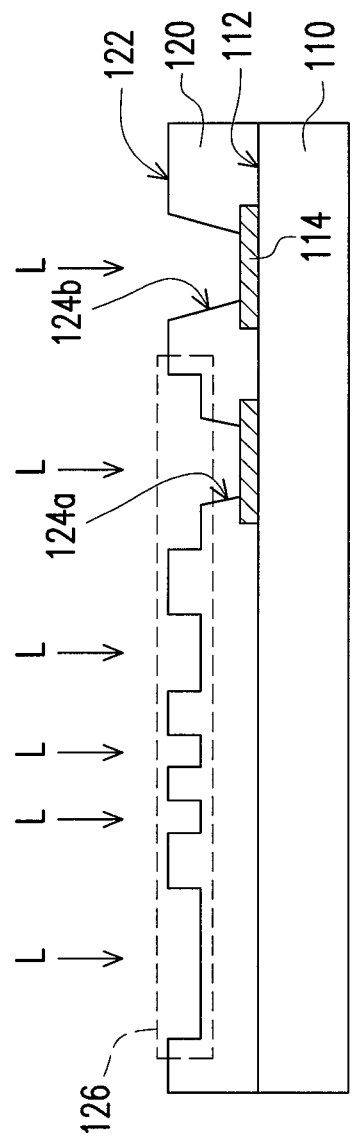

Referring to FIG. 2B, at least one blind via (FIG. 2B schematically shows two blind vias 124a and 124b) extending from the second surface 122 of the dielectric layer 120 to the first circuit layer 114 and a intaglio pattern 126 on the second surface 122 of the dielectric layer 120 are formed by using a laser beam L. The intaglio pattern 126 is connected to the blind via 124a. In the present embodiment, the laser beam L can be, for example, a infrared laser source, or an ultraviolet (UV) laser source.

Referring to FIG. 2C, a first conductive layer 130 is formed in the blind vias 124a, 124b. The method of forming the first conductive layer 130 in blind vias 124a, 124b can be, for example, a chemical deposition. More particularly, in the present embodiment, the height of the blind vial 24b (or the blind via 124b) is denoted as H and the thickness of the first conductive layer 130 is denoted as h, and the relationship between h and H complies with $0.2 \leq (h/H) \leq 0.9$.

Referring to FIG. 2D, an activation layer 150 is formed on the second surface 122 of the dielectric layer 120, in the intaglio pattern 126 and on the first conductive layer 130 for generating an initiation of the chemical deposition reaction which benefits the formation of the second conductive layer 140 and on the first conductive layer 130 in the later process step. Therefore, the blind vias are full filled with conductive material. In the present embodiment, the main material of the activation layer 150 can be, for example, palladium.

Figure 2E:
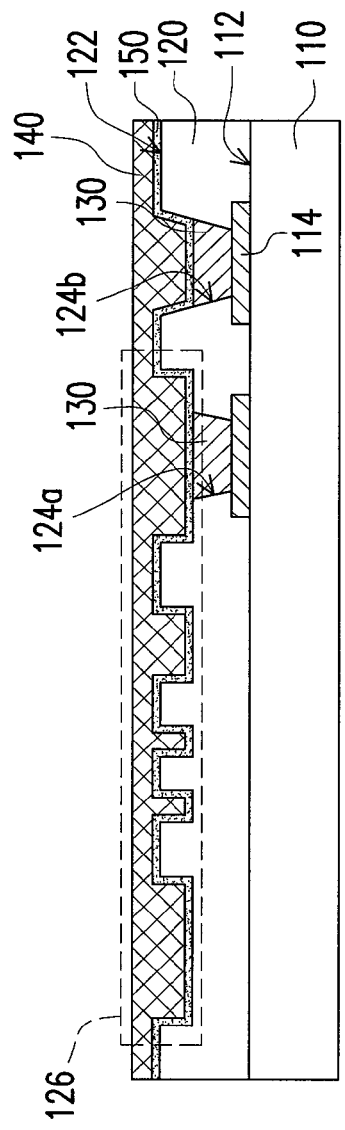

Referring to FIG. 2E, a second conductive layer 140 is formed in the intaglio pattern 126 and in the blind vias 124a, 124b, wherein the second conductive layer 140 covers the first conductive layer 130 and is electrically connected to the first circuit layer 114 through the first conductive layer 130. At the same time, the second conductive layer 140 covers the second surface 122 of the dielectric layer 120. In addition, a method of forming the second conductive layer 140 in the intaglio pattern 126 and the blind vias 124a, 124b can be, for example, a chemical deposition.

Figure 2F:
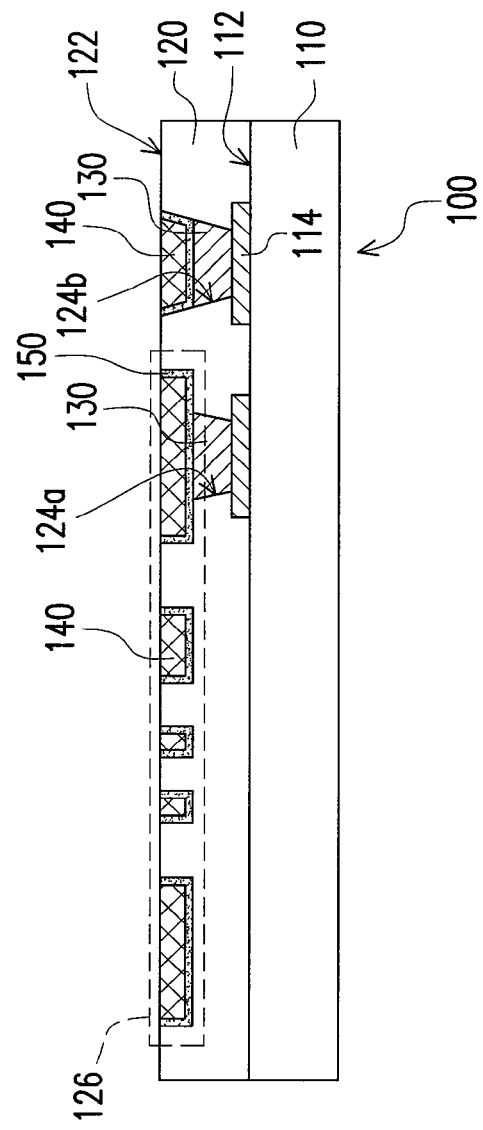

Referring to FIG. 2F, performing a grinding process to the second conductive layer 140 until the second surface 122 of the dielectric layer 120 is exposed. That is to say, the activation layer 150 located on the second surface 122 of the dielectric layer 120 is removed in the grinding process, such that the second conductive layer 140 is substantially aligned to the second surface 122 of the dielectric layer 120. So far, the manufacturing of the circuit board 100 is completed.

It has to be mentioned that although the grinding process is performed after forming the second conductive layer 140 in the present embodiment, the process of grinding can be omitted when the second conductive layer 140 deposited a smoother surface in other embodiments not illustrated. In other words, the grinding process in the present embodiment is a selective step according to the surface smoothness of the second conductive layer 140, not an essential step when manufacturing the circuit board 100.

In the process for fabricating the circuit board 100 of the present invention, the first conductive layer 130 is formed in the blind vias 124a and 124b in advance to decrease the step height between the blind vias 124a and 124b and the intaglio pattern 126, and then the second conductive layer 140 is formed on the first conductive layer 130 in the blind vias 124a and 124b and in the intaglio pattern 126. Hence, the thickness uniformity and the surface smoothness of the conductive layer formed in the blind vias 124a and 124b and the intaglio pattern 126 can be well improved. By comparing with the conventional technique, the process for fabricating the circuit board 100 of the present embodiment can effectively avoid the poor result of the conventional via filling plating and the poor uniformity of the conductive layer and can improve the reliability of the circuit board.

Accordingly, in the present invention, the first conductive layer is formed in the blind via to decrease the step height between the blind via and the intaglio pattern, so that the thickness of the second conductive layer disposed in the blind vias is substantially equal to the thickness of the second conductive layer to be disposed in the intaglio pattern. Hence, when the second conductive layer is disposed in the blind vias and in the intaglio pattern, the thickness uniformity and the surface smoothness of the second conductive layer can be well improved. By comparing with the conventional technique, the circuit board and the process for fabricating the circuit board of the present embodiment can effectively avoid the poor result of the conventional via filling plating and the poor uniformity of the conductive layer and can improve the reliability of the circuit board.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:
1. A process for manufacturing a circuit board, comprising:
providing a circuit substrate having a first surface and a first circuit layer;
forming a dielectric layer on the circuit substrate, wherein the dielectric layer has a second surface and covers the first surface and the first circuit layer;
illuminating the second surface of the dielectric layer with a laser beam to form at least a blind via extending from the second surface of the dielectric layer to the first circuit layer and an intaglio pattern extending from the second surface of the dielectric layer, wherein a depth of the blind via is greater than a depth of the intaglio pattern;
forming a first conductive layer in a part of a blind via; and
forming a second conductive layer in the intaglio pattern and in the rest of the blind via, wherein the second conductive layer covers the first conductive layer, and the second conductive layer is electrically connected to the first circuit layer through the first conductive layer.
2. The process for manufacturing the circuit board as claimed in claim 1, wherein the laser beam includes an infrared laser source or an ultraviolet (UV) laser source.

3. The process for manufacturing the circuit board as claimed in claim 1, wherein a method of forming the first conductive layer in the blind via comprises a chemical deposition.

4. The process for manufacturing the circuit board as claimed in claim 1, wherein a height of the blind via is denoted as H and a thickness of the first conductive layer is denoted as h, and a relationship between h and H complies with $0.2 \leq (h/H) \leq 0.9$.

5. The process for manufacturing the circuit board as claimed in claim 1, wherein before the step of forming the second conductive layer, further comprising:

forming an activation layer on the second surface of the dielectric layer, in the intaglio pattern and on the first conductive layer.

6. The process for manufacturing the circuit board as claimed in claim 1, wherein a method of forming the second conductive layer in the intaglio pattern the blind via comprises a chemical deposition.

7. The process for manufacturing the circuit board as claimed in claim 1, wherein after the step of forming the second conductive layer, further comprising:

performing a grinding process to the second conductive layer until the second surface of the dielectric layer is exposed.

8. The process for manufacturing the circuit board as claimed in claim 1, wherein the first circuit layer is embedded in the circuit substrate, and a surface of the first circuit layer is substantially aligned to the first surface.

9. The process for manufacturing the circuit board as claimed in claim 1, wherein the first circuit layer is disposed on the first surface of the circuit substrate.

10. The process for manufacturing the circuit board as claimed in claim 1, wherein the intaglio pattern is connected to the blind via.

11. The process for manufacturing the circuit board as claimed in claim 1, wherein the second conductive layer is substantially aligned to the second surface of the dielectric layer.

* * * * *